United States Patent
Nashida et al.

(10) Patent No.: US 9,640,454 B2
(45) Date of Patent: May 2, 2017

(54) SEMICONDUCTOR DEVICE

(71) Applicant: FUJI ELECTRIC CO., LTD., Kawasaki-shi, Kanagawa (JP)

(72) Inventors: Norihiro Nashida, Nagano (JP); Yoko Nakamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/933,449

(22) Filed: Nov. 5, 2015

(65) Prior Publication Data
US 2016/0079133 A1    Mar. 17, 2016

Related U.S. Application Data

(63) Continuation of application No. PCT/JP2014/062389, filed on May 8, 2014.

(30) Foreign Application Priority Data

Jun. 5, 2013   (JP) .................. 2013-118495

(51) Int. Cl.
| | | |
|---|---|---|
| H01L 23/053 | (2006.01) | |
| H01L 25/07 | (2006.01) | |
| H01L 25/18 | (2006.01) | |
| H01L 23/00 | (2006.01) | |
| H01L 23/08 | (2006.01) | |

(52) U.S. Cl.
CPC ............ H01L 23/053 (2013.01); H01L 23/08 (2013.01); H01L 24/01 (2013.01); H01L 25/07 (2013.01); H01L 25/18 (2013.01); *H01L 2924/1305* (2013.01); *H01L 2924/13055* (2013.01); *H01L 2924/13091* (2013.01)

(58) Field of Classification Search
CPC ......... H01L 25/07; H01L 25/18; H01L 24/01; H01L 23/08; H01L 23/053
See application file for complete search history.

(56) References Cited

U.S. PATENT DOCUMENTS

2012/0190242 A1    7/2012   Kataoka et al.

FOREIGN PATENT DOCUMENTS

| JP | H09-051152 A | 2/1997 |
|---|---|---|
| JP | 2005-285919 A | 10/2005 |
| JP | 2009-064852 A | 3/2009 |
| JP | 2010-278093 A | 12/2010 |
| JP | 2012-129336 A | 7/2012 |
| JP | 2012-151063 A | 8/2012 |

OTHER PUBLICATIONS

PCT, "International Search Report for International Application No. PCT/JP2014/062389".

*Primary Examiner* — Jarrett Stark
(74) *Attorney, Agent, or Firm* — Manabu Kanesaka

(57) ABSTRACT

A semiconductor device includes an insulating substrate having a circuit plate on a principal surface thereof; a semiconductor element fixed to the circuit plate; an external terminal having one end fixed to the circuit plate; and a printed circuit board facing the principal surface of the insulating substrate, and having a through-hole for passing through the external terminal. A rigidity of a peripheral region of the through-hole is lower than a rigidity of other regions.

10 Claims, 6 Drawing Sheets

Prior Art

Prior Art

SEMICONDUCTOR DEVICE

CROSS-REFERENCES TO RELATED APPLICATIONS

The present application is a Continuation Application of PCT International Application No. PCT/JP2014/062389 filed May 8, 2014, and claiming priority from Japanese Application No. 2013-118495 filed Jun. 5, 2013, the disclosure of which is incorporated herein.

TECHNICAL FIELD

The present invention relates to a semiconductor device, and more particularly, to a power semiconductor module on which a power semiconductor element is mounted.

BACKGROUND ART

FIGS. 4(a) and 4(b) are a plan view and a cross-sectional view of a power semiconductor module according to a related art, respectively. FIG. 4(b) is a cross-sectional view of a main part taken along line III-III in FIG. 4(a).

In FIGS. 4(a) and 4(b), a power semiconductor module 500 includes a direct copper bonding (DCB) substrate 104, a semiconductor element 106, a post electrode 108, an external terminal 110, and a printed circuit board 109.

The DCB substrate 104 has a circuit plate 103 formed on a principal surface thereof. The rear surface of the semiconductor element 106 is fixed to the circuit plate 103 by a bonding material 105. The post electrode 108 is fixed to a front surface of the semiconductor element 106 by a bonding material 107. The external terminal 110 is fixed to an external terminal insertion recess 112 formed in the circuit plate 103 by a conductive bonding material (not illustrated). The printed circuit board 109 has a metal layer 114 and the post electrode 108 is fixed thereto.

The power semiconductor module 500 has a structure in which an electric wire for connection to a rear-surface electrode (not illustrated) of the semiconductor element 106 is formed on the circuit plate 103, and an electric wire for connection to a front-surface electrode (not illustrated) of the semiconductor element 106 is formed on the printed circuit board 109 having the post electrode 108 and the metal layer 114 (for example, see Patent Literature 1).

FIGS. 5(a) to 5(c) illustrate the steps of manufacturing the power semiconductor module 500.

FIGS. 5(a) to 5(c) are schematic views illustrating the steps of manufacturing the power semiconductor module according to the related art, and FIG. 6 is an enlarged plan view of a through-hole according to the related art.

First, the conductive bonding material 105 such as a solder is placed on the DCB substrate 104. After that, the semiconductor element 106 is placed thereon, and the conductive bonding material 107 such as a solder is placed thereon (FIG. 5(a)). Subsequently, the external terminal 110 is inserted in the recess 112 formed on a surface of the DCB substrate 104 to which the semiconductor element 106 is bonded (FIG. 5(b)). Further, the printed circuit board 109 in which the surface of the post electrode 108 faces the DCB substrate 104 is set by inserting the external terminal 110 into the through-hole 113 formed in the printed circuit board 109 (FIG. 5(c)). This module is assembled collectively according to, for example, $N_2 \cdot H_2$ reflow and is finally manufactured by sealing the same with a resin. In this method, since the external terminal 110 is guided using the through-hole 13, the alignment of the printed circuit board 109 can be made without using a jig (for example, see Patent Literature 2).

Here, FIG. 6 illustrates an enlarged plan view of a printed circuit board and an external terminal insertion through-hole having a circular cross-sectional shape.

An inner diameter of the through-hole 113 formed in the printed circuit board 109 is approximately the same (up to +0.05 mm) as the outer diameter of the external terminal 110.

CITATION LIST

Patent Document

Patent Literature 1: Japanese Patent Application Publication No. 2009-64852
Patent Literature 2: Japanese Patent Application Publication No. 2012-129336

DISCLOSURE OF THE INVENTION

During manufacturing of the power semiconductor module 500, when the external terminal 110 is inserted in the recess 112 (FIG. 5(b)), the external terminal 110 may be inserted in a state of being inclined slightly rather than being vertical to the DCB substrate 104. When the external terminal 110 is inserted in the printed circuit board 109 in such a state, the printed circuit board 109 may be also inclined so that the post electrode 108 does not contact the front-surface electrode of the semiconductor element 106. In this case, floating or misalignment between the semiconductor element 106 and the post electrode 108 may occur. Thus, it is difficult to bond the semiconductor element 106 and the post electrode 108 by the bonding material 107 such as a solder and manufacturing defects may occur.

This problem can be solved by increasing the inner diameter of the through-hole 113 of the printed circuit board 109 to be larger than the inner diameter of the external terminal 110. By doing so, the influence of inclination or the like of the external terminal 110 can be reduced. However, in this case, a new problem occurs in that the misalignment of the printed circuit board 109 itself increases.

In particular, recent SiC semiconductor elements have a size of approximately 3 mm in square which is smaller than that of conventional Si semiconductor elements in order to improve the manufacturing yield. Thus, in order to obtain a large module current capacity using the SiC semiconductor element, it is necessary to mount a plurality of semiconductor elements on one power semiconductor module. Thus, it is important to secure satisfactory positioning accuracy of the printed circuit board 109 when the post electrode 108 and the semiconductor element 106 are connected. Due to this, an increase in misalignment of the printed circuit board 109 is a significant problem in manufacturing.

In order to solve the problem, according to an aspect of the present invention, there is provided a semiconductor device including: an insulating substrate which has on a principal surface thereof a circuit plate; a semiconductor element which is fixed to the circuit plate; an external terminal, one end of which is fixed to the circuit plate; and a printed circuit board which has a through-hole, through which the external terminal passes, and faces the principal surface of the insulating substrate. A rigidity of a peripheral region of the through-hole is lower than a rigidity of other regions.

According to the invention, even when an external terminal inserted in a recess of a DCB substrate that forms a power semiconductor module is inclined slightly, it is possible to decrease connection failure which can cause floating and misalignment of a printed circuit board. Due to this, it is possible to improve the yield rate of the assembled power semiconductor module.

The above-mentioned and other objects, features, and advantages of the present invention will become more apparent from the following description associated with the accompanying drawings illustrating preferred embodiments as examples of the present invention.

BEST MODE FOR CARRYING OUT THE INVENTION

Figure 1A:
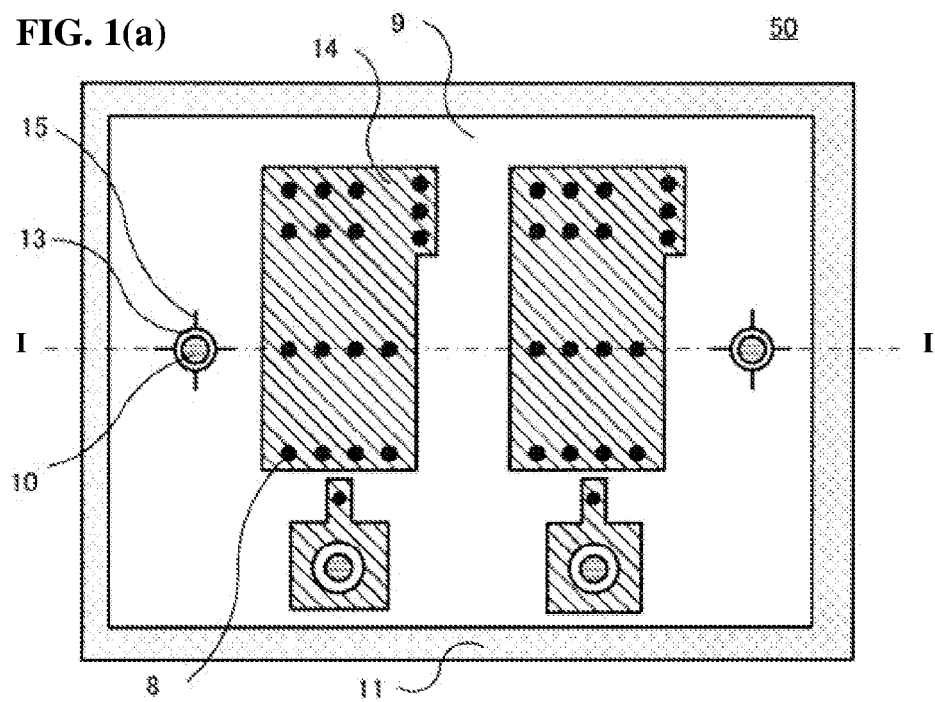
FIGS. 1(a) and 1(b) are a plan view and a cross-sectional view of a semiconductor device according to a first embodiment, respectively.

Hereinafter, preferred embodiments (practical examples) of the present invention will be described with reference to the drawings.

The same constituent elements throughout the embodiments will be denoted by the same reference numerals and redundant description thereof will not be provided.

Figure 1B:
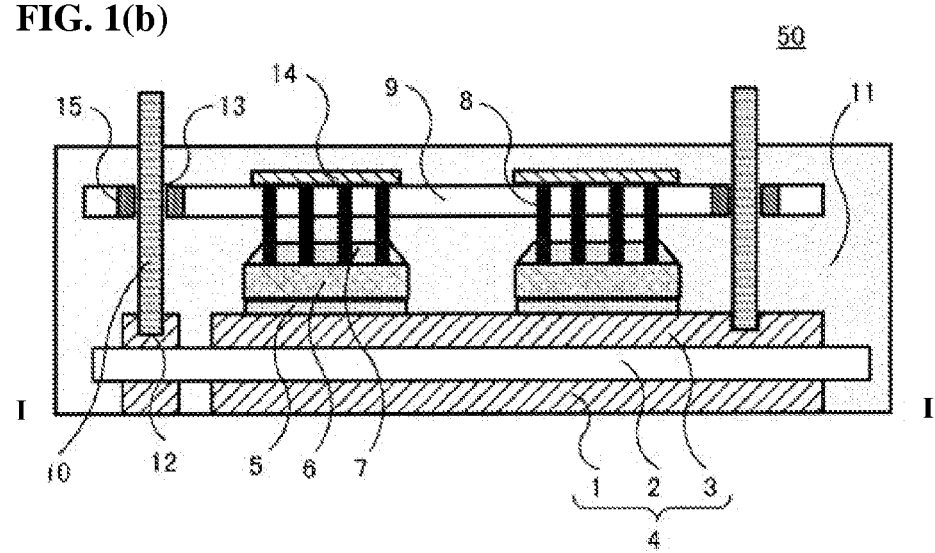

FIGS. 1(a) and 1(b) are a plan view and a cross-sectional view of a semiconductor device according to a first embodiment, respectively.

FIG. 1(b) is a cross-sectional view of a main part taken along line I-I in FIG. 1(a).

The illustrated power semiconductor module (semiconductor device) 50 has a structure in which a DCB substrate 4 and a printed circuit board 9 facing the DCB substrate 4 are integrated by a sealing resin 11. Moreover, a semiconductor element 6 is fixed to a circuit plate 3 positioned on a principal surface of the DCB substrate 4.

The DCB substrate 4 includes an insulating substrate 2, a heat-radiating plate 1 formed on a rear surface of the insulating substrate 2 according to a DCB method, and a circuit plate 3 formed on a principal surface of the insulating substrate 2 similarly according to the DCB method. The circuit plate 3 has a pattern which is selectively formed on the principal surface of the insulating substrate 2.

Further, at least one rear-surface electrode (for example, a collector electrode) of the semiconductor element 6 is bonded to the circuit plate 3 by a conductive bonding material 5 formed of a tin (Sn)-silver (Ag)-based lead-free solder or the like.

Here, the semiconductor element 6 is a vertical power semiconductor element such as, for example, an insulated gate bipolar transistor (IGBT), a power metal-oxide semiconductor field-effect transistor (MOSFET), or a free wheeling diode (FWD).

Moreover, the insulating substrate 2 is formed of ceramics such as, for example, a sintered alumina ($Al_2O_3$) compact or a silicon nitride ($Si_3N_4$), and the heat-radiating plate 1 and the circuit plate 3 are formed of metal containing copper (Cu) as its main component.

In addition to the DCB substrate 4 formed according to the DCB method, an active metal brazing (AMB) substrate obtained by bonding the heat-radiating plate 1 and the circuit plate 3 to the insulating substrate 2 by a brazing material may be used.

A metal layer 14 is selectively formed on a principal surface of the printed circuit board 9 as a pattern. Here, examples of a material of the printed circuit board 9 include a polyimide resin, an epoxy resin, and the like. Moreover, a glass cloth formed of a glass fiber may be impregnated in the printed circuit board 9 as necessary. Moreover, the metal layer 14 is formed of copper as its main component, for example.

In the power semiconductor module 50, a plurality of holes whose inner wall is processed with a plating layer (not illustrated) is formed in the printed circuit board 9 immediately above a region in which a front-surface electrode (for example, an emitter electrode) of the semiconductor element 6 is positioned. Moreover, a cylindrical post electrode 8 is implanted in the hole with a plating layer interposed. Further, the respective post electrodes 8 are in a state of being electrically connected to the metal layer 14 arranged on the principal surface of the printed circuit board 9. Due to this, in the power semiconductor module 50, electrical connection between the front-surface electrode of the semiconductor element 6 and an external circuit is secured by the post electrode 8 and the metal layer 14. Electrical connection between the rear-surface electrode of the semiconductor element 6 and the external circuit is secured by the circuit plate 3.

Examples of a main component of a material of the post electrode 8 include copper, aluminum (Al), a tin-silver-based lead-free solder material, and an alloy made from these metals. The respective post electrodes 8 have a uniform length.

Further, the power semiconductor module 50 has a positioning external terminal 10 that is fitted and fixed to an external terminal insertion recess 12 formed in the circuit plate 3. The printed circuit board 9 has a positioning through-hole 13 through which the external terminal 10 passes.

When the recess 12 and the external terminal 10 are fixed by a solder (not illustrated), it is possible to secure the strength for fixing the circuit plate 3 and the external terminal 10 with the aid of the fitting and solder-fixing.

Moreover, the sealing resin 11 is disposed around the constituent elements so as to protect the constituent elements from an external environment. As a result, the stress transmitted to the semiconductor element 6 and the conductive bonding materials 5 and 7 resulting from heating and cooling during the operation of the power semiconductor module 50 can be relieved. Thus, it is possible to realize a highly reliable power semiconductor module.

The present embodiment is different from the related art in that a peripheral region of the through-hole 13 in the printed circuit board 9, through which the external terminal 10 is inserted has lower rigidity than other regions so as to facilitate positioning. More specifically, slits 15 are disposed in the peripheral region of the through-hole 13 in a radial form. Since the rigidity of the peripheral region is decreased, even when the external terminal 10 is slightly inclined or deformed, only the peripheral region of the through-hole 13 can be deformed. Due to this, since an overall inclination and misalignment of the printed circuit board 9 can be suppressed, it is possible to secure satisfactory positioning accuracy of the post electrode 8. As a result, it is possible to obviate connection failure between the post electrode 8 and the semiconductor element 6 and to improve the yield rate of the power semiconductor module 50.

Figure 2A:
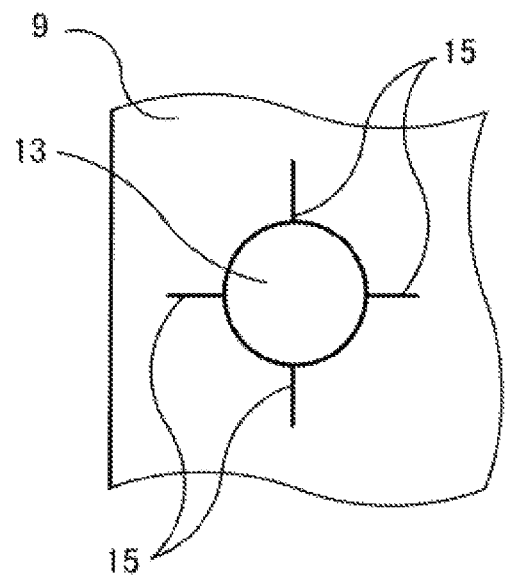
FIGS. 2(a) and 2(b) are enlarged plan views of a through-hole according to the first embodiment.
Figure 2B:
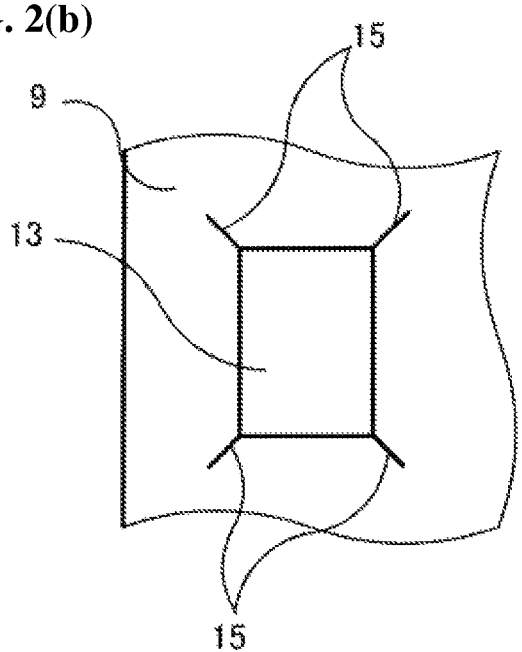

FIGS. 2(*a*) and 2(*b*) are enlarged plan view of a through-hole according to a first embodiment.

FIG. 2(*a*) illustrates a through-hole 13 for positioning using an external terminal 10 having a circular cross-sectional shape and four slits 15 are disposed in the peripheral region of the through-hole 13 in a radial and symmetrical form.

FIG. 2(*b*) illustrates a through-hole 13 for positioning using an external terminal 10 having a quadrangular cross-sectional shape and four slits 15 extending from the four corners of the quadrangle are disposed in the peripheral region of the through-hole 13. When the external terminal 10 and the through-hole 13 are quadrangles, since the corners of the external terminal 10 mostly contact the through-hole 13, it is effective to dispose the slits 15 in the corners of the through-hole 13 of the printed circuit board 9, through which the external terminal 10 passes.

Moreover, it is effective because the position of the printed circuit board 9 is rarely corrected (changed) to a certain direction when the slits 15 are disposed in a radial and symmetrical form. Although the number of slits 15 is not particularly limited as long as the slits 15 can be disposed in a radial and symmetrical form, it is preferable to dispose approximately four to eight slits when the number of additional steps for forming the slits 15 and the effect of disposing the slits 15 are taken into consideration.

The cross-sectional shape of the external terminal 10 and the through-hole 13 may be, for example, pentagonal to octagonal, and in this case, it is effective to form the slits 15 at the corners of the through-hole 13.

Figure 3A:
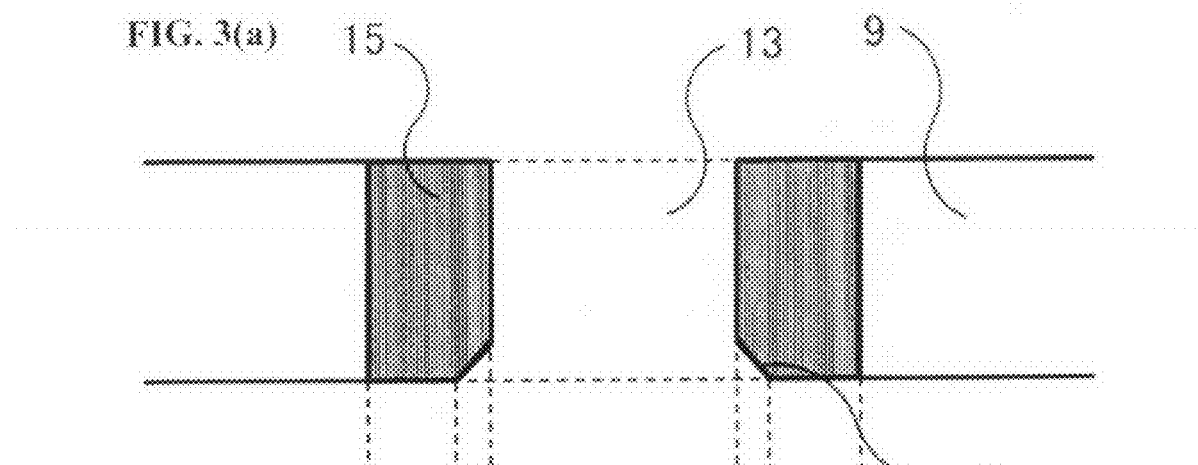
FIGS. 3(a) and 3(b) are an enlarged cross-sectional view and an enlarged bottom view of a through-hole according to a second embodiment, respectively.
Figure 3B:
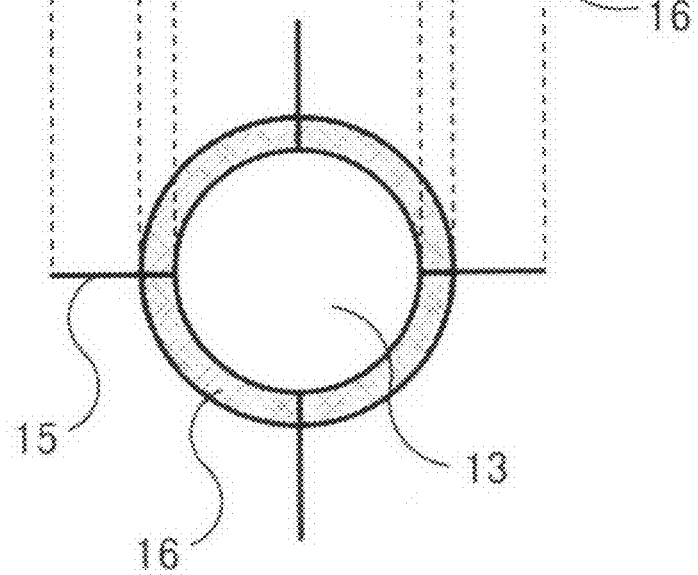
Figure 4A:
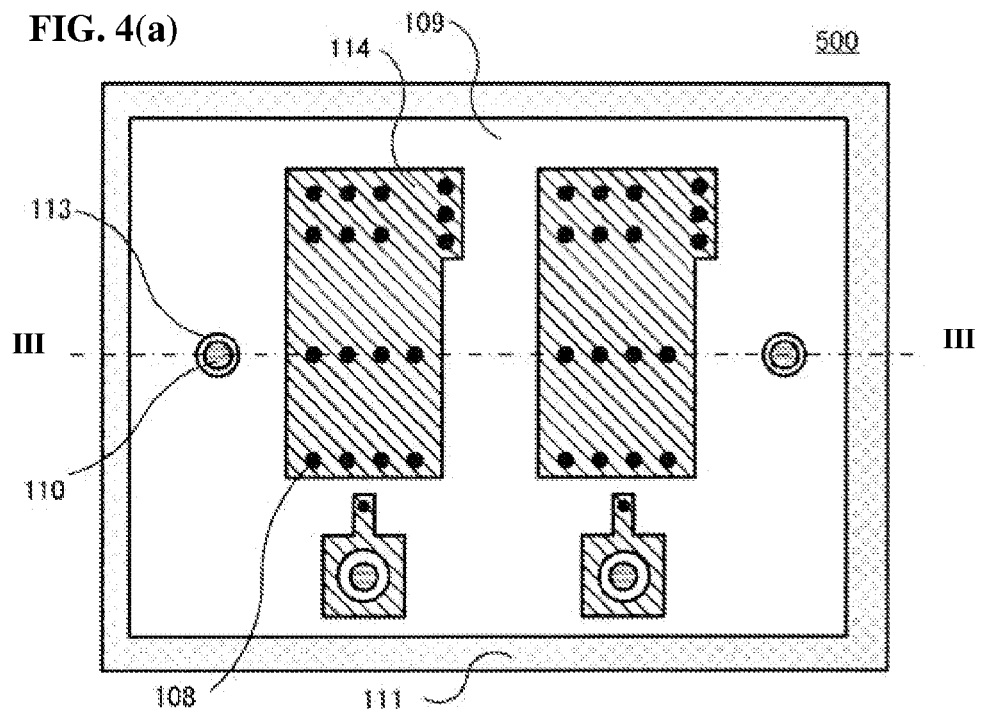
FIGS. 4(a) and 4(b) are a plan view and a cross-sectional view of a power semiconductor module according to a related art, respectively.
Figure 4B:
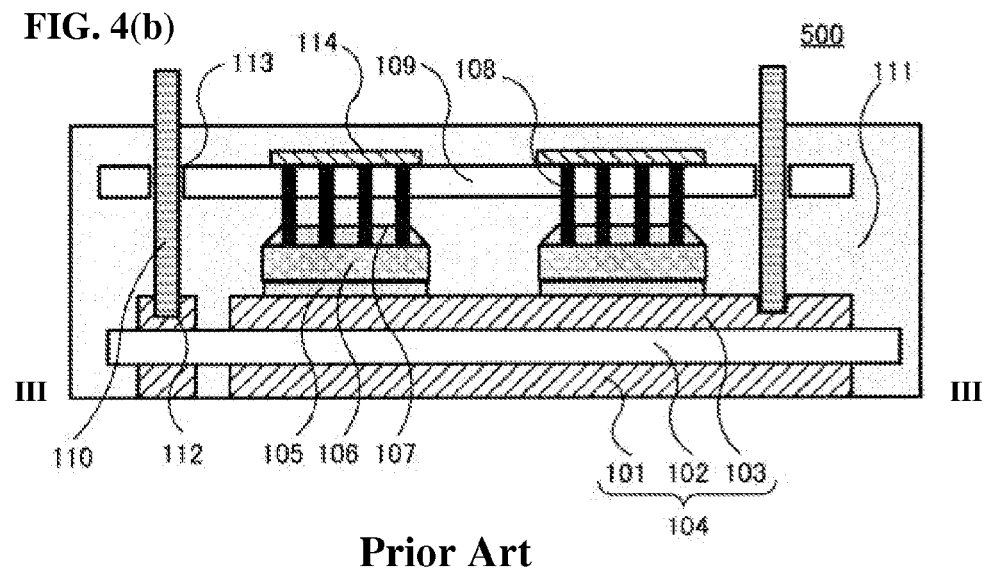
Figure 5A:
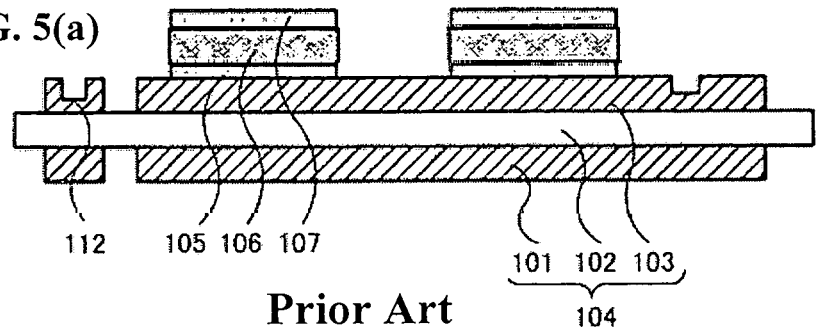
FIGS. 5(a) to 5(c) are schematic views illustrating the steps of manufacturing a power semiconductor module according to the related art.
Figure 5B:
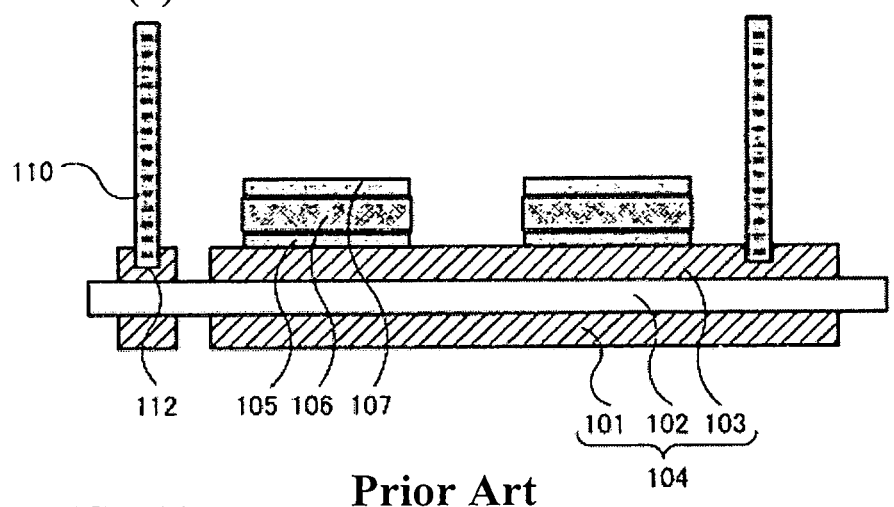
Figure 5C:
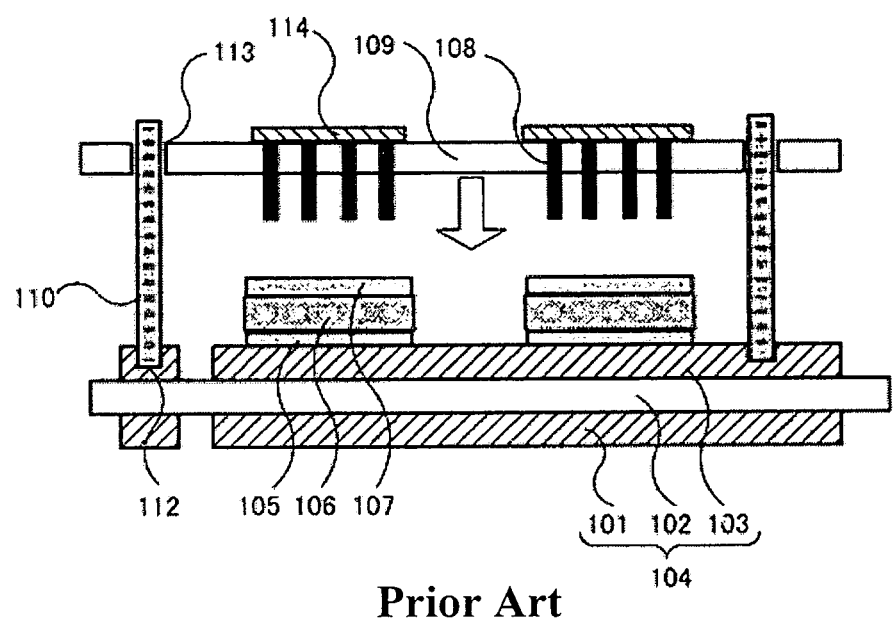
Figure 6:
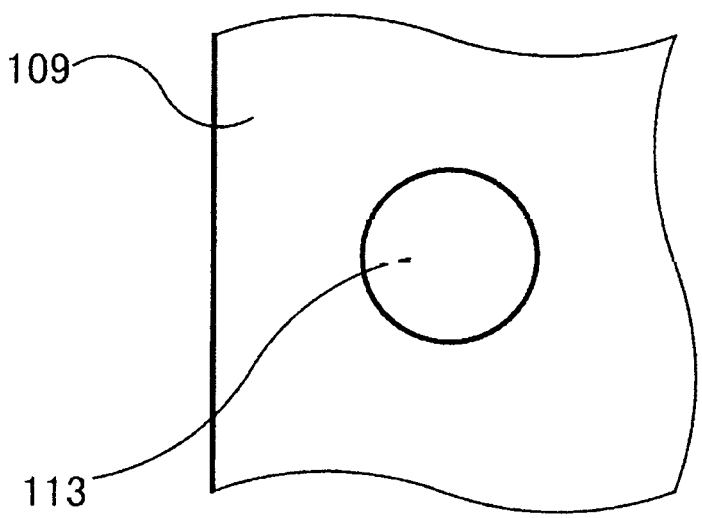
FIG. 6 is an enlarged plan view of a through-hole according to the related art.

FIGS. 3(*a*) and 3(*b*) are enlarged cross-sectional view and enlarged bottom view of a through-hole according to a second example, respectively.

In this embodiment, a bowl-shaped chamfered portion 16 is formed in a portion of a surface facing the insulating substrate 2 of the printed circuit board 9 near the through-hole 13 so as to be located approximately on the same axis as the through-hole 13.

By forming the chamfered portion 16, it is possible to decrease the rigidity of the peripheral region and to insert the external terminal 10 in the through-hole 13 while improving the positioning accuracy further. When the positioning accuracy is increased further, it is more effective because, even if the external terminal 10 is inclined slightly, the post electrode 8 can be connected to a predetermined position reliably by the function of the slit 15.

Only the principle of the invention has been described above. Various modifications and changes of the invention can be made by those skilled in the art. The present invention is not limited to the precise configurations and applications illustrated and described above. All of the corresponding modifications and the equivalents thereof fall within the scope of the invention defined by the appended claims and the equivalents thereof.

EXPLANATION OF REFERENCE NUMERALS

1: Heat-radiating plate
2: Insulating substrate
3, 103: Circuit plate
4, 104: DCB substrate
5, 7, 105, 107: Bonding material
6, 106: Semiconductor element
8, 108: Post electrode
9, 109: Printed circuit board
10, 110: External terminal
11: Sealing resin
12, 112: Recess
13, 113: Through-hole
14, 114: Metal layer
15: Slit
16: Chamfered portion
50, 500: Power semiconductor module

What is claimed is:

1. A semiconductor device comprising:
    an insulating substrate having a circuit plate on a principal surface thereof;
    a semiconductor element fixed to the circuit plate;
    an external terminal having one end fixed to the circuit plate; and
    a printed circuit board facing the principal surface of the insulating substrate, and having a through-hole for passing through the external terminal,
    wherein a rigidity of a peripheral region of the through-hole is lower than a rigidity of other regions.

2. The semiconductor device according to claim 1, further comprising a post electrode,
    wherein the semiconductor element has an electrode on a front surface thereof, and the post electrode has one end fixed to the electrode of the semiconductor element and another end fixed to the printed circuit board.

3. The semiconductor device according to claim 1, wherein the peripheral region is formed with a slit.

4. The semiconductor device according to claim 1, wherein the peripheral region is formed with a plurality of slits.

5. The semiconductor device according to claim 4, wherein the through-hole has a circular shape in a plan view, and
    the plurality of slits is formed radially at a uniform angle when viewed from the principal surface of the printed circuit board.

6. The semiconductor device according to claim 4, wherein the through-hole has a polygonal shape in a plan view, and
    the plurality of slits is formed radially to extend from apexes of respective corners when viewed from the principal surface of the printed circuit board.

7. The semiconductor device according to claim 6, wherein the polygonal shape is a quadrangular shape in the plan view.

8. The semiconductor device according to claim 1, wherein the peripheral region of a surface of the printed circuit board facing the insulating substrate is formed with a chamfered portion.

9. A semiconductor device comprising:
    an insulating substrate having a circuit plate on a principal surface thereof;
    a semiconductor element fixed to the circuit plate;
    an external terminal having one end fixed to the circuit plate; and
    a printed circuit board facing the principal surface of the insulating substrate, and having a through-hole shaped in a polygonal shape in a plan view for passing the external terminal therethrough, wherein a plurality of slits is formed radially and symmetrically on a peripheral region of the through-hole to extend from apexes of respective corners of the through-hole when viewed from the principal surface of the printed circuit board, and a rigidity of the peripheral region of the through-hole is lower than a rigidity of other regions in the printed circuit board.

10. The semiconductor device according to claim 9, wherein the polygonal shape is a quadrangular shape in the plan view, and the plurality of slits includes four slits, each extending from each apex of the quadrangular shape.

* * * * *